(12) United States Patent
Duparre et al.

(10) Patent No.: US 7,897,903 B2
(45) Date of Patent: Mar. 1, 2011

(54) IMAGE DETECTION SYSTEM OF OPTICAL CHANNELS ARRANGED NEXT TO ONE ANOTHER

(75) Inventors: Jacques Duparre, Jena (DE); Peter Dannberg, Jena (DE); Andreas Brueckner, Jena (DE); Andreas Braeuer, Schloeben (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 12/223,024

(22) PCT Filed: Jan. 23, 2007

(86) PCT No.: PCT/EP2007/000813
§ 371 (c)(1),
(2), (4) Date: Nov. 19, 2008

(87) PCT Pub. No.: WO2007/082781
PCT Pub. Date: Jul. 26, 2007

(65) Prior Publication Data
US 2009/0179142 A1 Jul. 16, 2009

(30) Foreign Application Priority Data
Jan. 23, 2006 (DE) ........................ 10 2006 004 802

(51) Int. Cl.
*H01L 27/00* (2006.01)
*H01J 3/14* (2006.01)
*H04N 5/225* (2006.01)
(52) U.S. Cl. ...................... 250/208.1; 250/216; 348/340
(58) Field of Classification Search .............. 250/208.1, 250/216; 257/294; 348/340
See application file for complete search history.

(56) References Cited

U.S. PATENT DOCUMENTS

2001/0026322 A1  10/2001  Takahashi et al. ........... 348/340

FOREIGN PATENT DOCUMENTS

DE         19755565         6/1998

(Continued)

OTHER PUBLICATIONS

"Thin observation module by bound optics (TOMBO) : concept and experimental verification"; Applied Optics/vol. 40, No. 11/Apr. 10, 2001; Tanida et al.; pp. 1806-1813.

(Continued)

*Primary Examiner*—Thanh X Luu
(74) *Attorney, Agent, or Firm*—Jacobson Holman PLLC (57) ABSTRACT

According to the invention, the image detection system contains optical channels arranged one next to the other with a respectively assigned microlens with aperture and in each case at least one detector located in the image plane, wherein the detectors are arranged such that the directions of the optical axes, which form in each case the connecting lines between lens apices and centre of the detectors, represent a function of the position of the respective optical channel, wherein at least one aperture stop arrangement (4) is provided between the microlenses (1') with aperture (2') and the detectors (6', 8), wherein the distance between centres of the aperture stops (4') is located between the distance between apices of the microlenses (1') and distance between centres of the detectors (6', 8) such that, depending on the position of the channels, the aperture stops (4') are arranged with different offsets to the microlenses (1') and the detectors (6', 8) and are in each case located on a straight line with them.

20 Claims, 6 Drawing Sheets

FOREIGN PATENT DOCUMENTS

| | | |
|---|---|---|
| EP | 0840502 | 5/1998 |
| JP | 2001237404 | 8/2001 |
| WO | WO 2005008781 A1 * | 1/2005 |
| WO | 2005069607 | 7/2005 |

OTHER PUBLICATIONS

"Close-up imaging of documents and displays with lens arrays"; Applied Optics/vol. 18, No. 4/Feb. 15, 1979; R. H. Anderson; pp. 477-484.

"Artificial apposition compound eye fabricated by micro-optics technology"; Applied Optics/vol. 43, No. 22/Aug. 1, 2004; Duparré et al.; pp. 4304-4310.

"Design and assessment of microlenslet-array relay optics"; Applied Optics/vol. 42, No. 34/Dec. 1, 2003; Shaoulov et al.; pp. 6838-6845.

* cited by examiner

IMAGE DETECTION SYSTEM OF OPTICAL CHANNELS ARRANGED NEXT TO ONE ANOTHER

This is a national stage of PCT/EP07/000813 filed Jan. 23, 2007 and published in German.

The invention relates to an image detection system according to the preamble of the main claim, as well as a method for manufacturing at least one image detection system.

Such an image detection system is known from WO 2005/069607 A1, with which regularly arranged optical channels in each case with a microlens and at least one detector arranged in its image plane, are provided, wherein at least one image point is extracted from the microimage behind the microlens. The optical axes of the individual optical channels have different inclinations, such that they represent a function of the distance of the optical channel from the middle point to the side of the image detection system which faces the image. With this, the ratio of the size of the visual field to the image field size may be determined in a targeted manner. Detectors are applied which have such a high sensitivity, that these have a larger centre-to-centre distance or pitch, given a small active surface.

With this known image detection system for example, a linear increase of the inclination of the optical axes from channel to channel is achieved for example by a difference in the centre difference or distance from centre to centre of the microlenses and of the detectors. Each optical channel to which a microlens, an aperture diaphragm assigned to this, and a detector, as the case may be, with a hole diaphragm, is assigned, by way of this "sees" in the adjacent direction of the channels connecting to it. By reading out the detector signals in the form of a matrix, in which the signals of the detectors are entered in rows or columns as the case may be, the image of the observed object follows without a further sorting of the signals of the detectors. It is thus possible from the coordinates of a channel in the array, to determine its viewing direction within the whole visual field of the camera or image detection system, and a two-dimensional image of a limited visual field arises.

In the case of a greater angle of incidence from regions outside the visual field of the objective, with an absence of optical insulation, a cross-talk of the light of the lenses of a channel on detectors, as the case may be, with hole diaphragms of adjacent channels occur, and thus the formation of ghost images. In order to prevent this, various arrangements and in particular absorbing separating walls between the channels have been suggested in WO 2005/069607. This arrangement however entails a large technological effort, particularly with the manufacture of replication tools, or the necessity of photo-lithograpic processes with high aspect ratios. Moreover, the image field is limited, since the assigned detector pixel must lie in the projection of the microlens.

The smallest resolvable angular distance, or with a known object distance, the smallest resolvable structure size, of the image detection system described in WO 2005/069607, is double the viewing angle difference, i.e. the inclination difference of the optical axes between adjacent channels. The angular resolution capacity of an ultra thin camera system for a desired visual field amongst other things is limited by the dimensions of the detector array and the maximum number of channels in the main symmetry axes which this entails. An increase of the angular resolution capacity by way of increasing the number of optical channels requires the expensive enlargement of the silicon surface of the detector array. A moderate resolution capacity over a large visual field is required for many simple imaging tasks, e.g. lane marking recognition, edge position detection or likewise. Imaging systems which apply these specifications with few channels imaging in parallel, when compared to high-resolution mega-pixel cameras, are distinguished by a low complexity as well as a rapid image processing and last but not least, by low manufacturing costs. Conventional macroscopic objectives for a distortion-free imaging of a large visual field are very complicated and expensive. The image quality with these objectives reduces towards the edge of the visual field and the image is distorted, so that objects may no longer be identified in an unambiguous manner. These problems may be partly compensated by the individual correction of each channel to its own individual viewing direction by way of the degrees of freedom of systems imaging in a channel-wise setup described in the mentioned document. The planar construction additionally has the advantage of saving of space.

It is the object of the invention, whilst taking into account the state of the art, to provide an image detection system according to the preamble of the main claim, which permits the suppression of ghost images and provides an enlarged scannable image field.

According to the invention, this objective is achieved by the characterising features of the main claim in combination with the features of the preamble.

Further advantageous further formations and improvements are rendered possible by the measures specified in the dependent claims.

The image detection system according to the invention solves the problem of ghost image suppression by way of hole diaphragms introduced additionally between micro-lenses and aperture diaphragms which are assigned to these micro-lenses, and detectors which are defined as detector pixels alone or as detector pixels with pinhole diaphragms connected with these. Thereby, one or more additional aperture diaphragm arrays may be provided between the microlens array and the detector array, whose centre distance lies between that of the microlenses and of the detectors, so that light of a certain angle of incidence for which indeed all diaphragm openings lie with the lens and detector pairwise on a straight line, in the channel envisaged for this, is focussed by a lens onto the detector assigned to it, and all other angles of incidence are blocked shortly in front of the image plane of the microlens; i.e. are absorbed or reflected, by way of the additional aperture diaphragm or by way of several additional aperture diaphragms. By way of this, for the whole concept of the described ultra thin image detection system, in contrast to the introduction of absorbing separating walls between the channels according to the state of the art, there results the significant advantage that a detector assigned to a lens or a channel does not necessarily have to be located directly in the "footprint" (projection perpendicular to array normal), thus directly behind these microlens, but may also be arranged greatly offset behind the adjacent lens or the next after the adjacent lens or further ones, for achieving a larger viewing angle, without ghost images arising on account of the cross-talk of the light. With this, the scannable image field of the microlenses becomes effectively larger, and a larger space-bandwidth-product arises, which has an advantageous effect with regard to resolution capacity, visual field size and light sensitivity of the imaging system. Moreover, since no separating walls need to be provided, one may use a continuously uninterrupted objective body, which improves the stability of the objective arrangement, amongst other things also by way of an adapted thermal expansion coefficient of the objective body with respect to that of the opto-electronic image sensor.

Each lens by way of the additionally assigned aperture diaphragm may focus exclusively onto the detector assigned to it, but not onto the detector of the adjacent lens, since the all aperture diaphragm openings only lie on an axis for the respective incidence angle provided for the channel. The size of the aperture diaphragm openings of several aperture diaphragm arrays lying above one another in the different layers, is adapted in each case to the diameter of the focussing light cone at the respective distance behind the microlens, and the offset of the respective aperture diaphragm relative to the lens or to the detector is adapted to the angle of incidence to be imaged with the respective channel.

In an advantageous manner, the type, shape and parameters of the microlenses may be used for the correction of off-axis image aberrations by way of the channel-wise adaptation to the respective viewing direction. Apart from the standard use of arrays of spherical lenses, one may also use arrays of variable, elliptical (anamorphotic) lenses for the correction of astigmatism and field curvature, and aspheric off-axis lens segments for increasing the visual field and the resolution with a complete aberration correction for the respective viewing direction.

There are different variants of the pitch grading between the different elements, i.e. the different planes, thus the aperture diaphragms of the microlenses may be centred directly below these, but may also have a pitch difference to these. The pitch difference (i.e. the difference between the respective centre to centre distances) between the lenses and detector pixels or hole diaphragms may be positive or negative, and the optical axes are then either directed to the inside or outside, and the arising image is either upright or upside down.

Basically, all measures and advantages of WO 2005/069607, with the exception of the provision of separating walls between the optical channels, may also be used with the present application, wherein for this reason the disclosure of this document is to be included into the present application.

Advantageously, the illumination with regard to the light emission, the light concentration and the light shaping, may be integrated into the image detection system or into the camera, for example by way of admitting space between the optical channels, in order to incorporate light sources, or it may be provided at a certain distance between groups of channels, or as a ring around the camera. Moreover, it is conceivable to attach light sources onto the lens plane, e.g. into the dead zones between e.g. spherical lenses packed in a square manner. Likewise, it is possible for only some lenses of the arrangement according to the invention to be applied, in order to focus onto a detector, and other lenses adjacent thereto to bundle, direct and/or distribute the light from sources located in the image plane of the microlenses onto the object to be observed. Laser diodes, LEDs or OLEDs or VCSEL or likewise may be used as light sources.

CMOS-sensors or CCD-sensors may be used as detector pixel arrays, but also arrays of polymer photodiodes, wherein the latter are advantageous, since a large sensor format does not cause such high costs as semiconductor detector arrays. Since these detectors may be manufactured with printing technology, just as the lens arrays and also the different aperture diaphragm arrays, over a long term it would appear that the printing of the complete camera is to be considered with regard to the manufacturing technology.

In an advantageous manner, the described imaging system may be adopted for colour image acquisition without any modifications, if an image sensor which acquires different colours directly in three pixel layers lying above one another is provided, instead of a conventional CMOS or CCD-sensor for greyscale image acquisition as a detector array. Such an image sensor is in contrast to conventional colour CMOS-sensors or CCD-sensors, with which colour filters are arranged next to one another on otherwise similar pixels.

Since with the image detection system according to the invention, the required filling factor of the detector pixels in the image plane is low, the detector pixels do not necessarily have to be square or rectangular, in order to be packed as densely as possible in a Cartesian raster. Indeed, other points of view may be taken into account with the design of the detector pixels, such as e.g. geometry of the PN-transition which causes a low dark current and has an advantageous effect on the signal-to-noise ratio. Thus e.g. circular pixels or pixels with a circular boundary of the PN-transition may be applied.

The image detection system according to the invention may also be applied for imaging close (a few cm) or very close (a few mm) objects with a magnification of 1 or smaller. Then, the difference of the pitch of the elements, i.e. in the centre-to-centre distance of the various layers, such as microlens array, aperture diaphragm array, detector array, is zero or very small, but a larger image sensor format is required depending on the size of the object to be imaged.

For the optics design in this configuration imaged approx. 1:1, it is advantageous to set the size of the solid angle on the object side, which is assigned to each channel as an image point, in a precise manner, such that in the object distance to the imaging system, the lateral object extension corresponding to this solid angle is as large as the pitch of the channels. Such systems may for example be applied via correlation algorithms as an optical mouse or as a thin microscope replacement with moderate resolution or as a close-up imaging system for plane objects.

In an advantageous manner, the different inclinations of the optical axes of the channels may be achieved in different ways. Thus the individual microlenses may be differentiated with regard to the decentration with respect to the detector, with respect to the focal length, and with respect to the conical and/or aspheric parameters. Micro-prisms may also be integrated into the individual microlenses, and finally the individual microlenses may be arranged on a convexly or concavely shaped base surface.

The detectors may be arranged on a convexly or concavely shaped base surface for influencing the size of the visual field.

One advantageous application of the invention is the highly accurate position detection of point sources, and position and orientation detection of edges, wherein the ultra thin camera system for the two dimensional image detection on the basis of 2D-microlenses, is modified such that the visual fields of adjacent optical channels at least party mutually overlap. This e.g. is achieved by choosing the centre distance between the lens array and detectors, or by way of the enlargement of the diameter of pinhole apertures, inasmuch as these have a smaller diameter than the photo-sensitive detector pixels. Both measures ensure that the viewing angle difference between adjacent optical channels becomes smaller than half the effective width of the visual field of one channel. By way of this, one achieves an angular position detection of the simply structured objects such as point sources, edges or low frequency rectangular bar targets, which are located in the common visual field region, by way of the evaluation of the relations of the intensity values measured in adjacent channels, with a high accuracy, which lies beyond the structure size of the smallest resolvable structure size, which is set by the resolution capacity of the imaging optical system. A highly accurate position detection is possible by way of this Embodiment examples of the invention are represented in the drawings and are explained in more detail in the subsequent description.

There are shown in.

Figure 1:
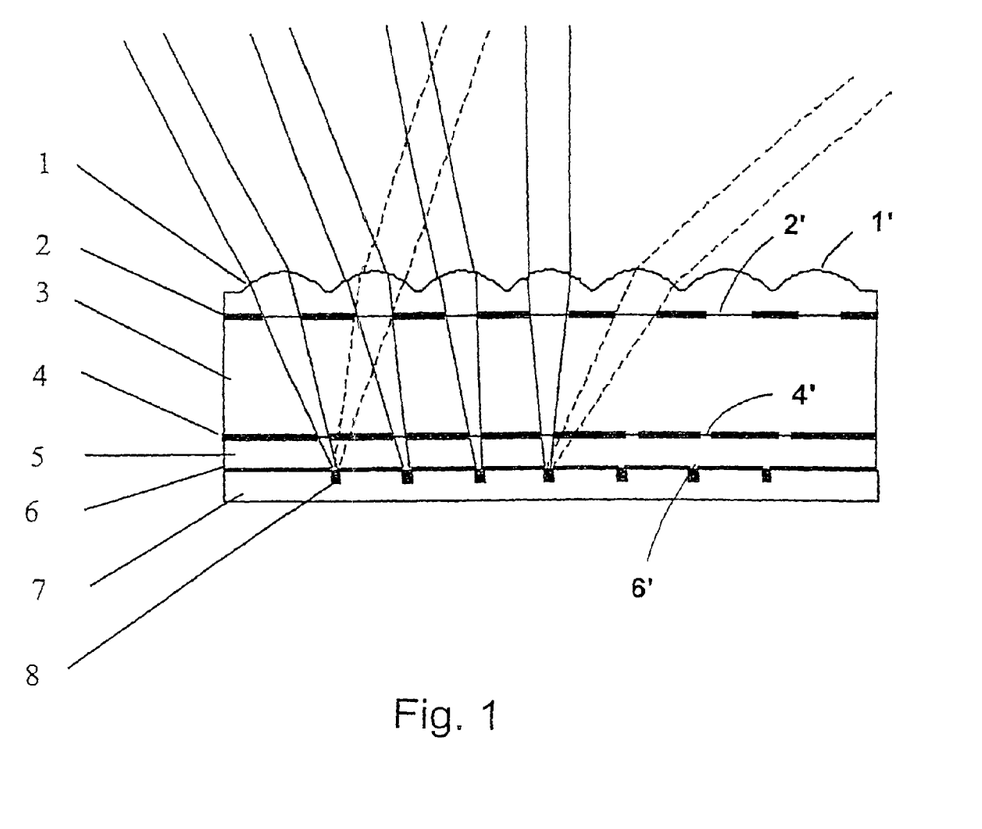
FIG. 1 a schematic lateral section of the image detection system according to the invention, FIG. 2 a plan view of the image detection system according to the invention, according to FIG. 1, FIG. 2A a plan view of an alternate image detection system according to the invention, according to FIG. 1, with elliptic microlenses, FIG. 3 a part view of the image detection system according to the invention, according to FIG. 1, with which the detector is arranged greatly offset to the associated microlens, FIG. 4 a schematic lateral view of an optowafer and a wafer, on which the detector arrays are located, from which the image detection system is manufactured by way of singularisation, FIG. 5 a schematic representation of the optical system of an image detection system with partly overlapping visual fields of adjacent channels, in a lateral view (FIG. 5A) and a representation of the angular sensitivity, plotted as a function of the angle in the visual field (FIG. 5B), and FIG. 6 a schematic representation of the detection of the angular position of a point source within the visual field of three optical channels with overlapping visual fields.
Figure 2:
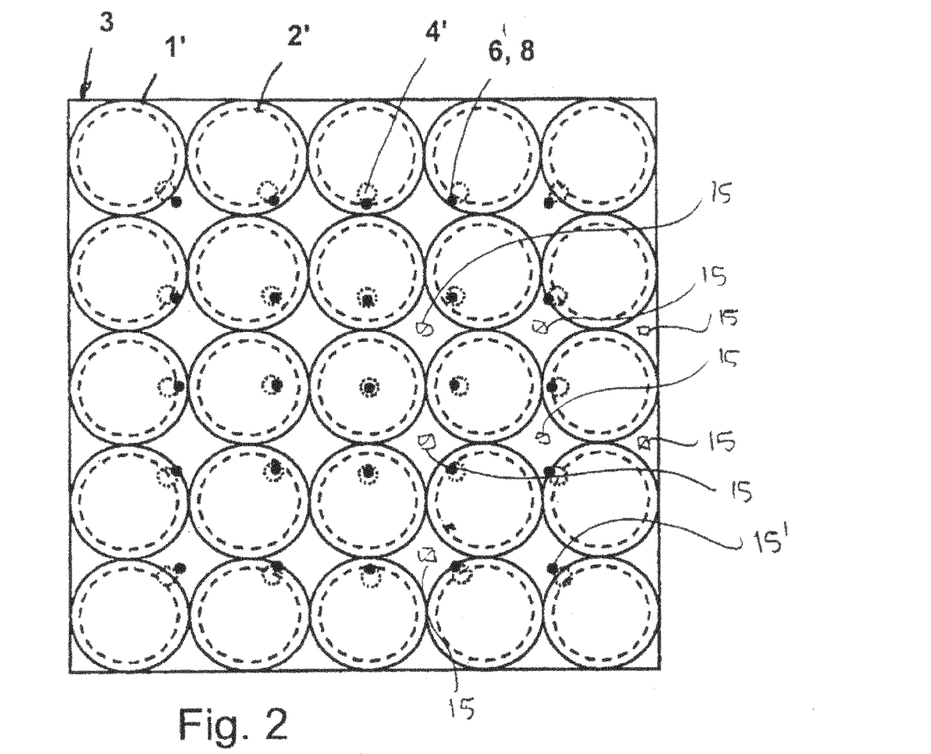
Figure 2A:
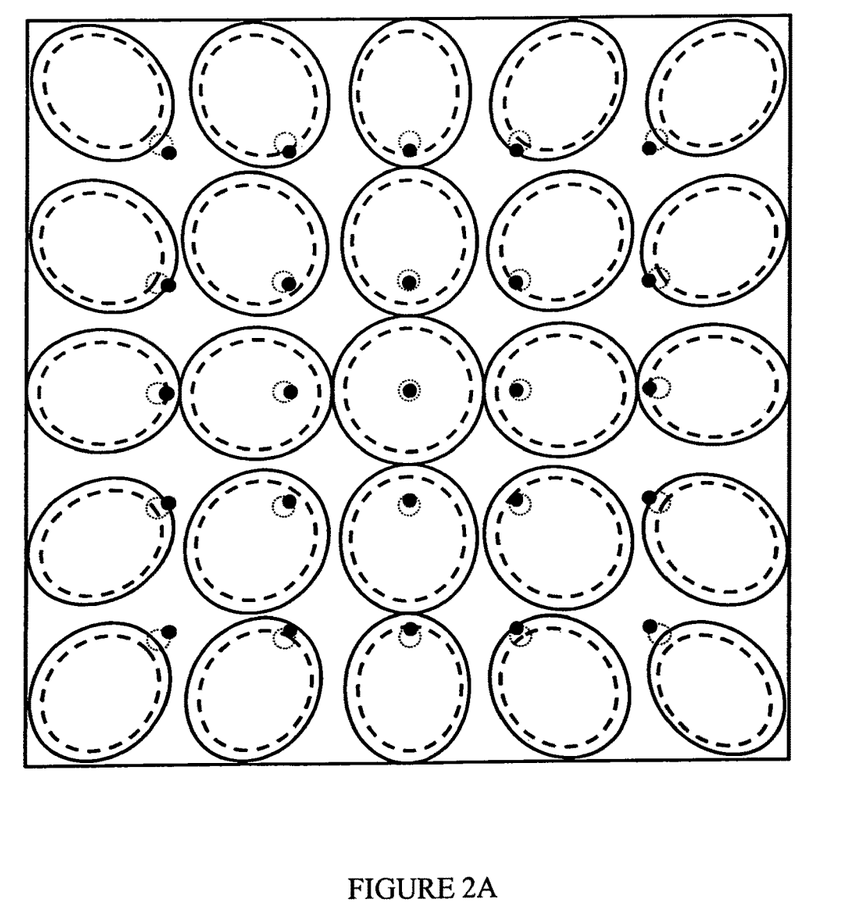

The image detection system represented in FIGS. 1 and 2 comprises a transparent objective body 3 onto which a microlens array 1 with a multitude of individual lenses 1' is deposited, wherein the lenses 1' are designed as spherical microlenses in the represented embodiment example (FIG. 2). An aperture diaphragm array 2 is arranged between the microlenses 1' and the objective body 3, directly below the microlens array 1. Aperture diaphragms 4', likewise in the form of an array 4, are provided below the objective body 3, for the suppression of ghost images axially close to the image plane of the microlenses 1', wherein detectors, which in the embodiment example are formed by detector pixels 8 on a detector pixel substrate 7 and by pinhole diaphragms 6' of a hole diaphragm array 6, lie in the image plane. The pinhole diaphragm array 6 may be omitted if the area of the photo-active detector pixels 8 is small enough, i.e. the assigned detector is then the detector pixel 8 itself. A distance layer 5 is arranged between the diaphragm array 4 for ghost image suppression and the pinhole diaphragm array 6. A microlens 1' with an aperture diaphragm 2' lying therebelow, a detector pixel 8 which is assigned to the lens 1' and has a pinhole diaphragm 6' and a diaphragm 4', form an optical channel, wherein one may recognise from FIG. 2 that several optical channels lie next to one another in the manner of a matrix.

As may be recognised from FIGS. 1 and 2, the optical axes of each optical channel, proceeding from the middle of the image detection system is provided with different inclinations in a regular manner in the radial direction. Thereby, the optical axis of each channel is defined as a connection line between the apex of a microlens 1' and the middle of the assigned detector, i.e. the middle of the assigned pinhole diaphragm 6'.

In FIG. 2, the diaphragm 2' of a microlens is represented by the large, dashed circle, and the aperture diaphragm 4' shortly in front of the image plane of a microlens 1' for suppressing the crosstalk, as a small dotted circle, and the detector, i.e. the detector pixel 8 covered by the pinhole diaphragm 6', is represented as a full point. One may recognise that the aperture diaphragms 4' for ghost image suppression, as well as the detectors are arranged differently offset in a plan view, depending on the middle of the camera in the X- and Y-direction, i.e. depending on the position of the respective channel. One may thus say that the inclination or the direction of the optical axes of the optical channel, which is defined between a microlens 1' and detector 6, 8 extracting an image point from the microimage behind this lens, is a function of the radial coordinate in the array proceeding from a channel with a perpendicular optical axis. Light sources 15 are arranged around some optical channels for illumination. The light source 15' replaces a detector 8 and emits light which is directed mainly towards the object space.

As may be recognised from FIG. 1, the diaphragm array 4 between the microlens array 1 and the detector plane, serves for separating the optical channels, wherein several layers of diaphragm arrays 4 may be provided. The centre distance of the holes or openings of an array 4 is selected such that just only a bundle from the lens onto the associated detector is focussed at the angle of incidence envisaged for this, but other angles of incidence are blocked. These regions of the diaphragm 4' within the respective circles are transparent and the regions outside are suitably absorbing or reflecting, preferably however are designed in an absorbing manner, in order to reduce the level of scattered light.

In FIG. 1, the manner of functioning of the diaphragm array 4 may be recognised. The shown continuous light bundles represent the main viewing directions of each optical channel and the focussing of the respective bundles. In contrast to this, the dashed beam bundles by way of example are to represent the appearance of ghost images due to crosstalk of light from microlenses 1' onto detectors which are not assigned to them, i.e. corresponding to their predefined viewing direction, without displaying the presence of the diaphragm array 4. The cross-talk of light would be produced when focussing onto adjacent detectors or those lying even further away. The crosstalk and thus the appearance of ghost images are alleviated by way of the introduction of the diaphragm array 4.

Figure 3:
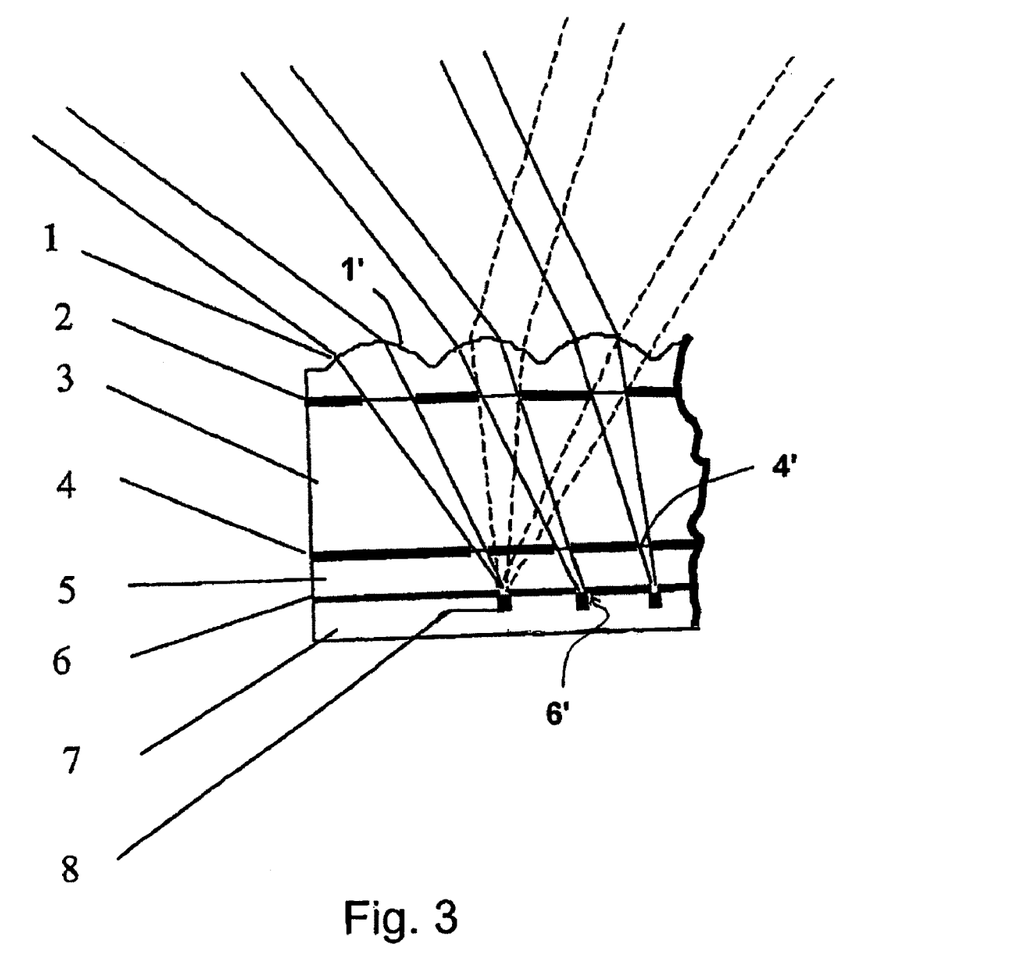

FIG. 3 shows that a detector assigned to a microlens 1' or to a channel, and consisting of detector pixels 8 and a hole diaphragm 6' in the embodiment example, does not necessarily have to be located directly in the footprint, i.e. directly behind this microlens 1', but for achieving a greater viewing angle of the channel, which is defined by the undashed beam bundle, may also be arranged greatly offset behind the adjacent lens or behind the adjacent lenses of this, without ghost images which are represented by the dashed beam bundle, arising by crosstalk. With this, the scannable image field of the microlenses 1' becomes effectively larger, which has an advantageous effect with regard to the resolution capacity, visual field size and light intensity of the imaging system.

The number of the optical channels may lie in the magnitude of 10×10 to 1'000×1'000, depending on the filed of application, wherein a square shape according to FIG. 2 is not required. The size of the microlenses 1' also defines the size of the optical channels, wherein a diameter of the microlens is in a region between 10 µm to 1 mm. The microlens array 1 consists of a plastic material and may be manufactured by way of different technologies, such as embossing, injection moulding or likewise. The objective body 3 may be designed as glass or as a transparent plastic material, and the aperture diaphragm arrays and pinhole diaphragm arrays as metal coatings, but also as a black polymer.

Figure 4:
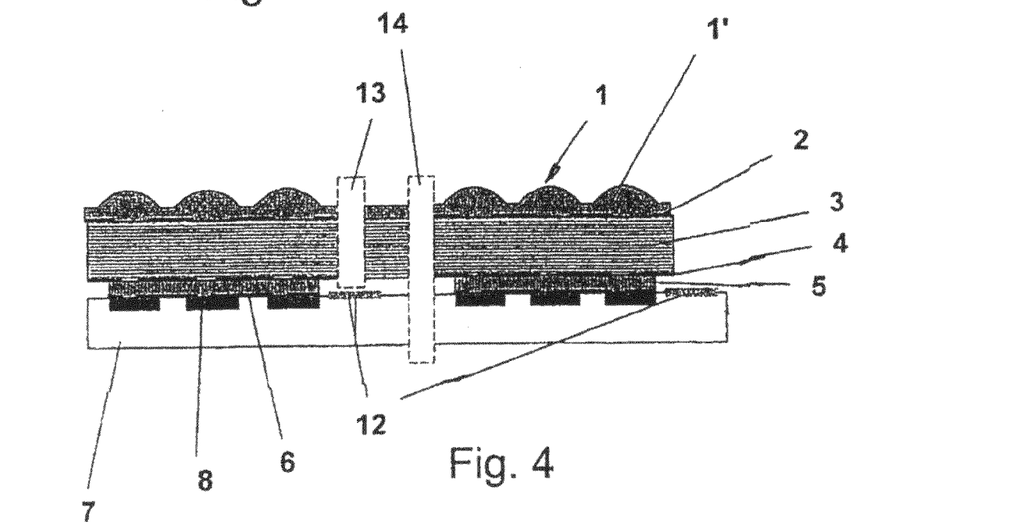

The manufacture of one embodiment of the flat camera with ghost image suppression is described by way of FIG. 4. In this embodiment, the imaging system is produced by the front side and rear-side structuring on a thin objective body 3, preferably of glass. Thereby, firstly the aperture diaphragm array 2 assigned to the microlens array is deposited onto the objective body 3 on the front side, and the diaphragm array for ghost image suppression is deposited on the rear side, e.g. in the thin absorbing polymer or in a metal, by way of coating and lithography. Subsequently, on the front side, the lens array 1 is created by way of UV-replication, and on the rear side the distance layer 5 is manufactured in a polymer which can be structured by photo-lithography. In the case that the detector pixels 8 of the sensor array need to be restricted in size by way of an additional pinhole diaphragm array 6, and in the case that the latter may not be produced on the detector substrate, the pinhole diaphragm array or the pinhole diaphragm layer 6, e.g. as a metal or black polymer with photo-structured holes, is deposited onto the distance layer on the rear side of the whole arrangement. The radius of curvature of the microlenses 1' is set in a precise manner, such that they focus onto the detector pixels 8 or the pinhole diaphragm 6' which cover these.

Thus an optowafer is manufactured, with which a plurality of flat cameras may be realised. Thereby, a photo-structuring of the distance layer 5 for the waferscale assembly of the manufactured optowafer, with a wafer on which the detector pixels 8 are located, is advantageous. This structuring is carried out such that a gap is created between two adjacent arrangements for the later thin camera. Bonding pads 12 are deposited onto the substrate 7 with the detector pixels 8, and these are required for the later contacting of the detector pixel matrix. The manufactured optowafer is subsequently connected to the wafer, on which the detector arrays are located, e.g. by way of bonding and curing, in a manner such that the gaps lie between the distance layers 5 above the bonding pads 12, and a cavity of the height of the distance layer 5 is formed. Subsequently, the cameras are singularised by a chip saw. By way of the cavity, one ensures that although one may sever the layers 1-4 with a chip saw 13, one may not inadvertently damage the layers 6-8. Subsequently, the camera is singularised from the wafer composite according to the saw sheet 14 by way of several differently deep cuts which lie next to one another. The area of the objective that is sawn out is narrower than that of the chip of the detector array. By way of this, one may manufacture a camera chip, where the lateral projection of the detector chip expands beyond the lateral projection of the thin objective after the singularisation, and thus the contactability of the bonding pads is ensured.

Figure 5:
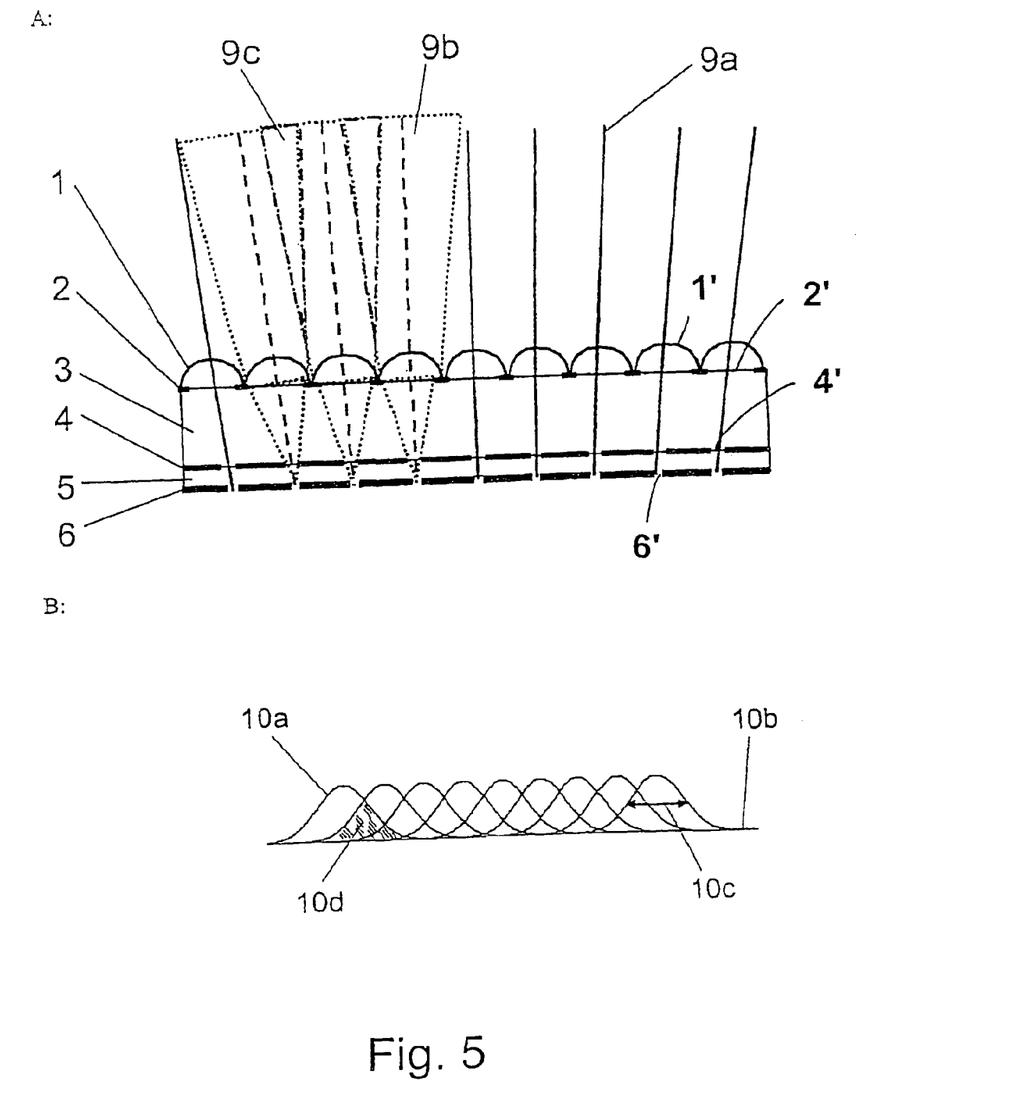

Hereinafter, the parameters for this example according to FIG. 4 are specified:

Thicknesses of the different layers or arrays [μm]:
1: 45; 2: 1.5; 3: 215; 4: 1.5; 5: 30; 6: 0.2;

Pitches (centre-to-centre or apex distance) of the different elements in an array [μm]:
1: 107.2; 2: 107.2; 4: 106.15; 6: 106.0; 8: 106.0;

Diameter of the openings of the different elements in an array [μm]:
1: 105; 2: 90; 4: 16; 6: 2;
Number of elements in an array: 84×64;
Radius of curvature of the microlenses 1': 103 μm;
Materials: 1,5: UV-curable photopolymer;
2,4: black matrix polymer; 3: glass; 7, 8: CMOS-sensor A part of a camera is represented in FIG. 5, with which the visual fields of adjacent optical channels partly overlap, wherein such a camera serves for the highly accurate position detection of point sources or position detection and orientation evaluation of edges. Such an imaging system may be applied in fields of application, in which one or more simply structured objects, such as point sources and edges, are detected with a compact imaging optical system, and the angular positions or the lateral object positions, with a known object distance of these within the visual field, must be determined with a high accuracy and little effort, i.e. with a low data quantity and short processing time. In the industrial field, edge position recognition is of particular interest and moreover road marking recognition in the car or surveillance tasks in the course of production is conceivable.

The overlapping of the visual fields according to FIG. 5 is for example achieved by way of setting the centre distance between the lens array 1 and a pinhole diaphragm array 6 or detector array, or by way of enlargement of the pinhole diaphragm diameter, inasmuch as these have a smaller surface extension than the photosensitive detector pixels 8.

In FIG. 5A, the viewing direction of a channel, i.e. the optical axis, is indicated at 9a, and the visual field of the individual optical channel is indicated at 9b, and the overlapping region of adjacent visual fields is indicated at 9c.

The angular sensitivity of the ultra thin camera according to FIG. 5A is plotted in dependency of the angle in the visual field in FIG. 5B, wherein 10a is the angular sensitivity function of a channel, 10b the angular axis, 10c the effective width of the visual field of a channel and 10d the overlapping region of the angular sensitivity function. The previously described measures for overlapping the visual fields of adjacent optic channels ensure that the viewing angle difference between adjacent optical channels is smaller than half the effective width of the visual field of one channel. Such an overlapping is necessary, so that an object point is simultaneously seen with different channels, and differently intense signals may be measured.

Figure 6:
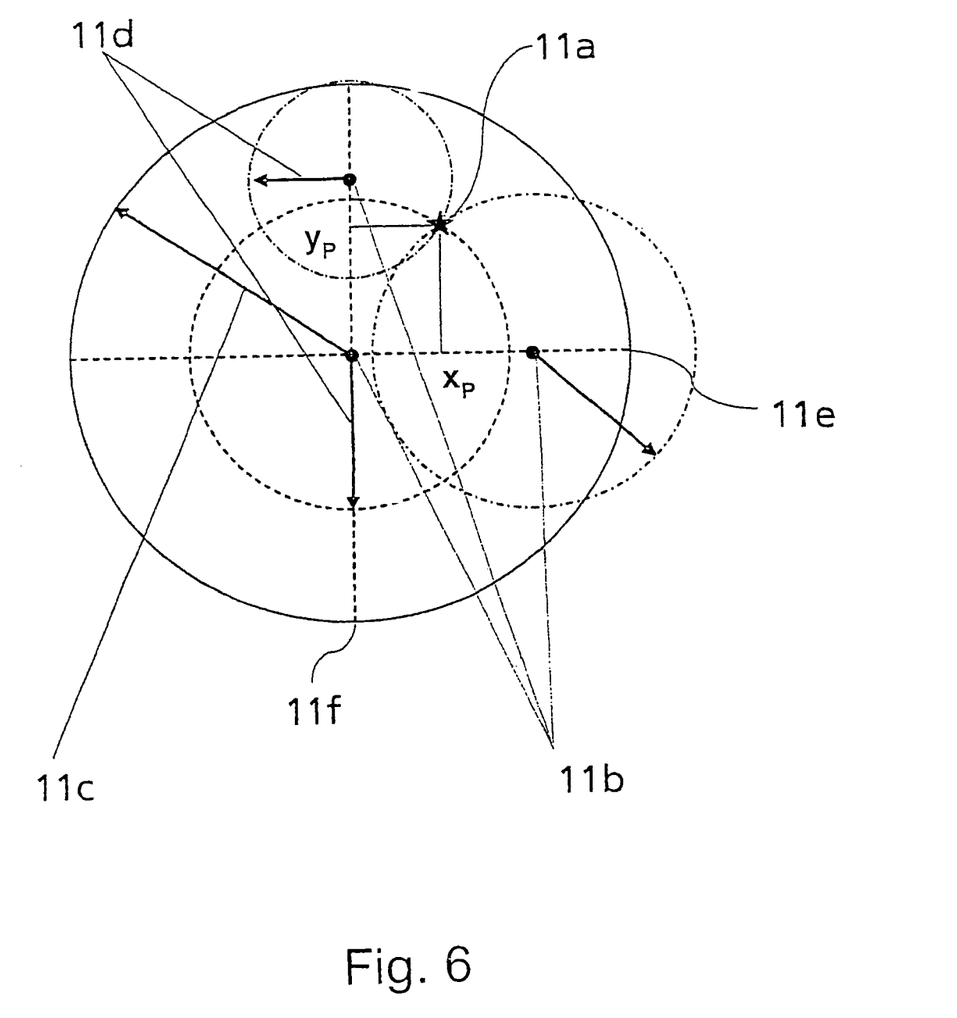

The schematised representation for determining an angular position of a light source within the visual field of three optical channels with overlapping visual fields is represented, in FIG. 6. Thereby 11a indicates the position of the point sources projected into the image plane. 11b are the contact points of the optical axes of three channels with the image coordinate plane projected over the focal width. 11e is the connection axis of horizontal, adjacent channels (X-axis), and 11f is the connection axis of vertical, adjacent channels (Y-axis). The radii of the projected point source positions within the visual fields of the individual optical channels are indicated with the reference numeral 11d.

When evaluating point sources or point-like objects, one must take into account that the conditions of the intensity values measured in the pinhole diaphragms 6' of adjacent optical channels of a camera according to FIG. 5, are independent of the absolute brightness of the object or the irradiance of the light source, as well as independent of fluctuations of the absolute brightness or the irradiance, inasmuch as these may be neglected over the integration time of the detector. The angular position of the objects located in the common visual field region may be determined by way of evaluating an intensity relationship. If such an object is located in the common visual field of three optical channels according to FIG. 6 (several optical channels are possible), then depending on the lateral distance of the point source to the optical axis of the respective channel, one may measure a specific intensity in the associated pinhole diaphragm 6' or in the following detector pixel 8. The relationship, with regard to the formula, as to what component of a light quantity beamed onto the optical channel is transmitted from the optical axis into the image plane, is known from theoretic considerations whilst utilising the angular sensitivity according to 5B. This knowledge is utilised in order to calculate the position of the source. From the relationship of the intensities of two adjacent pinhole diaphragms 6', one may determine the co-ordinates $x_p$, $y_p$ of the point source which are projected onto the image plane with the focal length. After computation of the horizontal and vertical coordinates $x_p$, $y_p$ of the point source, its angular position in the visual field of a reference channel is known, and thus its angular position in the visual field of the complete ultra-thin camera is also known by accounting for the assignment of the viewing direction of the specific channel.

The computation method is to be explained in more detail in the following example.

If one observes an axis in the coordinate system which is formed by projecting the image field with the focal length, in the visual field of the central channel (characterisation 11e) in FIG. 6, then the position of a point source measured on this axis is indicated at $x_p$. It is related to the angular position of the point source in the visual field of the central channel via the relation:

FORMEL EINFÜGEN $\phi_p$ therein describes the angular position of the point source in the visual field, $r_p$ the radial distance from the contact point of the optical axis with the coordinate plane projected with the focal length, as well as f the focal length of the objective. $y_p$, as noted in FIG. 6, is the coordinate of the point source on the second coordinate axis.

It is known from theoretical considerations, that the intensity distribution in the image plane of each channel of the objective results from the mathematical convolution of the object intensity distribution with the angular sensitivity function (10a in FIG. 5B) of the respective channel. For objects which may be mathematically (approximately) described as point sources or edges, the result of the convolution is a relation which is composed of the absolute brightness (or the absolute irradiance) of the source, and of the value of the angular sensitivity function at the position of the point source ($x_p$, or $r_p$ or $\phi_p$) or for edges, additionally of an integral expression over the angular sensitivity function at the position of the edge. Generally, different intensities according to the described relationship are measured in the respective pinhole diaphragms or subsequent detector pixels, by way of the overlap of the visual fields of adjacent channels, if the source is located in the overlap region of the visual field of the channels. The expression which arises from the relationship of the intensity values measured in two adjacent channels is independent of the absolute brightness or the irradiance of the source, and may be solved to attain the coordinate of the point source or edge in the projected coordinate plane ($x_p$).

This procedure is carried out in an analogous manner for the second coordinate axis 11f in FIG. 6, in order to obtain $y_p$ and, from this, the radial distance from the contact point of the optical axis to the coordinate plane ($r_p$) projected with the focal length, as well as the angular position of the source in the visual field of the central channel ($\phi_p$).

If the described method is to be used for edge position detection, then additionally, the orientation of the edge to the transversal main symmetry axes of the camera has to be determined. This is achieved in a relatively simple manner by way of searching for equal intensity and/or contrast values in the image. Then, the intensity values of different detector pixels are evaluated according to the method described above, perpendicularly to the orientation of the edge which is found in this manner, in order to detect the edge position in the visual field of the camera with a high accuracy.

The mentioned method for position detection may be used in the simplified form also with a camera which is only designed as one line. It is possible e.g. to detect the movement of a contrast edge in the visual field of this line with a high angular resolution.

The invention claimed is:

1. An image detection system of optical channels arranged next to one another, each optical channel having an optical axis in an axial direction and having a microlens with an apex and an aperture diaphragm and at least one detector lying in an image plane, said image detection system comprising
   the at least one detector of each channel having a diameter which is an order of magnitude smaller than a diameter of the microlens and the detectors of the channels being arranged such that directions of respective optical axes form connection lines between the apexes of the microlenses and centers of the detectors and represent a function of a position of the respective optical channel,
   at least one diaphragm arrangement with a pitch between its diaphragms, the diaphragm arrangement being arranged between the microlenses and the detectors, the microlenses comprising the aperture diaphragms,
   the pitch of the diaphragms of the diaphragm arrangement lying between a pitch of the microlenses and a pitch of the detectors so that depending on a position of the optical channels, the diaphragms are arranged differently offset to the microlenses and the detectors and each diaphragm lying on a straight line with the detectors and the microlenses, respectively.

2. The image detection system according to claim 1, wherein the detectors assigned to the respective channels are at least partly arranged in a manner, such that they lie in a projection of the microlenses of, in each case, adjacent channels or ones lying laterally even further away.

3. The image detection system according to claim 1, wherein the detectors are designed as detector pixels on a substrate, or as detector pixels with a pinhole diaphragm set in front.

4. The image detection system according to claim 1, wherein each optical channel detects at least one certain solid angular segment as a corresponding image point, in a manner such that an entirety of transmitted image points on the detector arrangement permits a reconstruction of an object to be observed.

5. The image detection system according to claim 1, wherein the microlenses are elliptical.

6. The image detection system according to claim 1, wherein the microlenses are arranged on a convexly or concavely shaped base surface, and the detectors on an arcuate substrate surface.

7. The image detection system according to claim 1, wherein an offset of the diaphragms for ghost image suppression, with respect to the microlenses or the detectors is adapted to angles of incidence to be imaged with the respective optical channel.

8. The image detection system according to claim 1, wherein light sources are arranged between the optical channels or groups of optical channels, or around the optical channels.

9. The image detection system according to claim 8, wherein the light sources are LEDs, OLEDs, VCSEL or LASER diodes.

10. The image detection system according to claim 1, wherein the detectors are CMOS-sensors or CCD-sensors or a photodiode array consisting of polymer material.

11. The image detection system according to claim 1, wherein visual fields of adjacent optical channels partly mutually overlap.

12. The image detection system according to claim 11, wherein a viewing angle difference between adjacent optical channels which is given by an angular distance between the respective optical axes, is smaller than half a width of a visual field of one channel.

13. The image detection system according to claim 1, wherein several diaphragm arrangements are arranged in different planes between the microlenses and the detectors.

14. The image detection system according to claim 13, wherein the diaphragm arrangements have different center-to-center distances to one another, and/or with different distance layers, are distanced to one another, and to the detectors or the microlenses.

15. The use of an image detection system according to claim 11, further comprising an evaluation device for detection of a position of point-like objects whilst utilizing a relation of intensities of adjacent optical channels, which are detected by the detectors.

16. The use of an image detection system according to claim 11, further comprising an evaluation device for detection of an orientation and a position of edges by evaluating intensity values or contrast values detected by the detectors, and using a relation of intensities of adjacent optical channels.

17. The image detection system according to claim 1, wherein a diameter of the microlens is between 10 μm and 1 mm.

18. An image detection system of optical channels arranged next to one another, each optical channel having an optical axis in an axial direction and having a microlens with an apex and an aperture diaphragm and at least one detector lying in an image plane, said image detection system comprising the at least one detector of each channel having a diameter which is an order of magnitude smaller than a diameter of the microlens and the detectors of the channels being arranged such that directions of respective optical axes form connection lines between the apexes of the microlenses and centers of the detectors and represent a function of a position of the respective optical channel, at least one diaphragm arrangement with a pitch between its diaphragms, the diaphragm arrangement being arranged between the microlenses and the detectors, the microlenses comprising the aperture diaphragms, the pitch of the diaphragms of the diaphragm arrangement lying between a pitch of the microlenses and a pitch of the detectors so that depending on a position of the optical channels, the diaphragms are arranged differently offset to the microlenses and the detectors and each diaphragm lying on a straight line with the detectors and the microlenses, respectively, in an image plane of the microlenses, the at least one detector being replaced by a light source which directs, bundles and/or distributes light from the image plane via the microlens, onto an object to be observed.

19. An image detection system of optical channels arranged next to one another, each optical channel having an optical axis in an axial direction and having a microlens with an apex and an aperture diaphragm and at least one detector lying in an image plane, said image detection system comprising the at least one detector of each channel having a diameter which is an order of magnitude smaller than a diameter of the microlens and the detectors of the channels being arranged such that directions of respective optical axes form connection lines between the apexes of the microlenses and centers of the detectors and represent a function of a position of the respective optical channel, at least one diaphragm arrangement with a pitch between its diaphragms, the diaphragm arrangement being arranged between the microlenses and the detectors, the microlenses comprising the aperture diaphragms, the pitch of the diaphragms of the diaphragm arrangement lying between a pitch of the microlenses and a pitch of the detectors so that depending on a position of the optical channels, the diaphragms are arranged differently offset to the microlenses and the detectors and each diaphragm lying on a straight line with the detectors and the microlenses, respectively, the optical channels and the microlenses having a magnification of about 1, and an object-side solid angle assigned to each channel as an image point, being set such that in the object distance, the lateral extension of an object which corresponds to the solid angle being as large as the distance of the channels.

20. An image detection system of optical channels arranged next to one another, each optical channel having an optical axis in an axial direction and having a microlens with an apex and an aperture diaphragm and at least one detector lying in an image plane, said image detection system comprising the at least one detector of each channel having a diameter which is an order of magnitude smaller than a diameter of the microlens and the detectors of the channels being arranged such that directions of respective optical axes form connection lines between the apexes of the microlenses and centers of the detectors and represent a function of a position of the respective optical channel, at least one diaphragm arrangement with a pitch between its diaphragms, the diaphragm arrangement being arranged between the microlenses and the detectors, the microlenses comprising the aperture diaphragms, the pitch of the diaphragms of the diaphragm arrangement lying between a pitch of the microlenses and a pitch of the detectors so that depending on a position of the optical channels, the diaphragms are arranged differently offset to the microlenses and the detectors and each diaphragm lying on a straight line with the detectors and the microlenses, respectively, a first aperture diaphragm array assigned to the microlenses and a second diaphragm array being deposited onto a front side and a rear side of a transparent objective body, a microlens array of the microlenses being arranged on the first aperture diaphragm array, a transparent distance layer being arranged on the second diaphragm array, a substrate with an array of detector pixels lying below a distance layer, and a pinhole diaphragm array being deposited on the distance layer or the substrate with the detector pixels, the objective body consisting of glass, the lens array and the distance layer of a structured polymer, the diaphragm array of an absorbing polymer or metal, and the pinhole diaphragm array of metal layer or polymer layer.

* * * * *